United States Patent [19]

Sugimoto

[11] 4,425,547
[45] Jan. 10, 1984

[54] NUCLEAR MAGNETIC RESONANCE APPARATUS HAVING MEANS FOR COMPENSATING A PROJECTING SIGNAL

[75] Inventor: Hiroshi Sugimoto, Ootawara, Japan

[73] Assignee: Tokyo Shibaura Denki Kabushiki Kaisha, Japan

[21] Appl. No.: 272,071

[22] Filed: Jun. 9, 1981

[30] Foreign Application Priority Data

Jun. 13, 1980 [JP] Japan ................................. 55-79789

[51] Int. Cl.³ ........................................... G01R 33/08
[52] U.S. Cl. .................................. 324/318; 324/309; 324/321
[58] Field of Search ................ 324/300, 309, 318, 321

[56] References Cited

U.S. PATENT DOCUMENTS

| | | |
|---|---|---|
| 3,789,832 | 2/1974 | Damadian . |
| 4,254,373 | 3/1981 | Lippmaa ............................ 324/321 |
| 4,333,053 | 6/1982 | Harrison ........................... 324/309 |
| 4,354,499 | 10/1982 | Damadian ......................... 324/309 |
| 4,374,360 | 2/1983 | Sepponen ......................... 324/309 |

OTHER PUBLICATIONS

P. C. Lautebar, "Image Formation by Induced Local Interactions: Examples Employing Nuclear Magnetic Resonance," Nature vol. 242, Mar. 16, 1974, pp. 190-191.
Crooks et al., "Tomographic Imaging with Nuclear Magnetic Resonance," Investigative Radiology, Jan.-Feb. 1978, pp. 63-66.

Primary Examiner—Michael J. Tokar
Attorney, Agent, or Firm—Finnegan, Henderson, Farabow, Garrett & Dunner

[57] ABSTRACT

A nuclear magnetic resonance apparatus in which information of a nuclear magnetic resonance distribution of a specified atomic nucleus in multiple directions in a body to be examined is obtained by magnet devices for making a homogeneous static magnetic field overlap a gradient magnetic field and for electrically rotating the isomagnetic field surface of the gradient magnetic field with respect to a coil wound around the body for impressing electromagnetic waves on the body, a receiver for detecting nuclear resonance as a result of impressing the magnetic fields and electromagnetic waves upon the body, a coil holder made of a material containing none of the specified atomic nucleus both for holding the coil in a predetermined shape and for suitably spacing the coil from the body, a pair of standard signal sources made of a material containing the specified atomic nucleus and disposed in the coil holder to face each other through a body positioned in the coil for compensating a projection signal, and a drive device for rotating the coil holder with its signal sources and the coil as a unit in synchronism and cooperation with the electric rotations of the gradient magnetic field, the paired standard signal sources always being positioned in the isomagnetic field surfaces on both sides of the body whereby an image of the concentration distribution of the specified atomic nucleus in a specified plane of the body is obtained.

3 Claims, 13 Drawing Figures (a)

(b)

(a)

(b)

(c)

NUCLEAR MAGNETIC RESONANCE APPARATUS HAVING MEANS FOR COMPENSATING A PROJECTING SIGNAL

BACKGROUND OF THE INVENTION

This invention relates to a nuclear magnetic resonance apparatus for measuring the concentration distribution or the like of a specified atomic nucleus in a body to be examined from the outside of the body without any surgical invasion by the use of the nuclear magnetic resonance (NMR) phenomenon.

The general construction of such diagnostic NMR apparatus is shown in FIG. 1. In this construction, projection data from plural directions are obtained without any rotation or parallel movement of the body being examined. This is accomplished by ascertaining the distribution of a specified atomic nucleus in a predetermined angular direction with the use of a gradient magnetic field overlapping a static magnetic field and by electrically rotating the gradient direction of the gradient magnetic field with respect to a specified plane of the body.

In FIG. 1, an oscillator 1 generates high-frequency waves the amplitude of which can be changed and a bridge type receiver 2 detects an NMR signal from a body P to be examined by use of the output of the oscillator 1. A coil 3 is wound around the body P for impressing the high-frequency waves (e.g., electromagnetic waves) from the oscillator 1 through the receiver 2 upon the body P and for extracting the NMR signal from the body P and feeding the signal back to the receiver 2.

An amplifier 4 amplifies the NMR signal fed to the receiver 2 and a recorder 5 records the NMR signal in synchronism with modulation of a magnetic field which is established by later-described modulating coils 12. A reconstructor 6 reconstructs the concentration distribution image of the specified atomic nucleus (e.g., hydrogen) from the NMR projection signals which are recorded in the respective angular directions by the recorder 5. A display 7 displays the image which is reconstructed by the reconstructor 6.

A pair of electromagnets 8 generates a homogeneous static magnetic field between magnet plate members 10 of the electromagnets and a D.C. stabilizing power supply 9 drives the electromagnets. A pair of shims 11 made of a magnetic materials and protruding from opposing surfaces of the magnet plate members 10 establish a magnetic field that is gradient with respect to the shown direction Y. Modulating coils 12 are driven by an A.C. power supply 13 and establish an alternating magnetic field of low frequency in a manner to overlap the static magnetic field.

Gradient magnetic field coils 14 are driven by a control power supply 15 (e.g., a stabilizing power supply) and establish such a magnetic field as is gradient with respect to the shown direction Z, acting as a gradient magnetic field electromagnet device. By controlling the output of the control power supply 15, it is possible to vary the gradient of the magnetic field which is established by the gradient magnetic field coils 14 and which is gradient with respect to the direction Z. Since the total gradient magnetic field can be established as the vector summation of the gradient magnetic field in the direction Z and the gradient magnetic field in the direction Y, the total gradient magnetic field can be rotated by controlling the output of the control power supply 15.

With the construction thus far described, the projection data of the concentration of the specified atomic nucleus in a specified plane of the body in various angular directions can be obtained without any rotation of the body P.

However, the method thus far described has the following problems:

(a) If a static magnetic field (Ho) varies with the drift of the stabilizing power supply 9 and/or the variation, or the like, in the spacing between the magnet planes due to the variation in the room temperature, the projection information signal PS, is shifted, as shown in FIG. 2, in accordance with those variations with respect to the phase of the output current of the A.C. power supply 13 for the modulating coils, as indicated at PS2. In other words, the body P appears to be moved. If this variation proceeds during the collecting procedure of the projection data, a distortion is established in the reconstructed display image.

(b) If the gradient of the gradient magnetic field (Gz) is varied as a result of the drift or the like of the control power supply 15 for the gradient magnetic field coils 14 similar to the case (a), the projection information signal PS3 is either compressed (in case the gradient is increased), as indicated at PS4, or elongated (in case the gradient is decreased), as indicated at PS5, in a manner to correspond to the variation in the gradient of the gradient magnetic field (Gz), as shown in FIGS. 3(a), (b) and (c), respectively. Since, in this case, the position of the body P is also apparently varied, the reconstructed picture image is distorted if the variation takes place during the collecting procedure of the projection information signal. Incidentally, in case the static magnetic field (Ho) has an intensity of 1 to 10 K Gauss whereas the gradient magnetic field (Gz) has an intensity of 1 Gauss/cm, an apparent variation in the thickness of the body reaches as high as 5% even for the variation of 1/1000 to 1/10,000 because it corresponds to the fact that the body is varied 1 cm.

(c) Another but larger problem is that, since the high-frequency magnetic field (H1) to be established in the body P by the coil 3 is not uniform inside of the body P, the NMR signal from the specified atomic nucleus in the body P is projected with different weights according to the positional relationships with the coil 3. The distribution of the high-frequency magnetic field (H1) is highly distorted especially in the vicinity of the lead portion of the coil 3. It therefore follows that the projection information signal has to be compensated for each projection direction.

SUMMARY OF THE INVENTION

It is, accordingly, an object of this invention to provide a nuclear magnetic resonance apparatus which can easily compensate for variations in the static magnetic field and in the gradient magnetic field and can also easily compensate for irregularity in the high-frequency magnetic field.

Briefly, this and other objects are achieved by an improvement in nuclear magnetic resonance apparatus in which information as to the nuclear magnetic resonance distribution of a specified atomic nucleus in multiple directions in a body to be examined by means of a homogeneous static magnetic field overlapping a gradient magnetic field and means for electrically rotating the isomagnetic field surface of said gradient magnetic field with respect to said body and coil means, including a coil wound around the body for impressing electromagnetic waves upon the body and for detecting nuclear resonance signals in response to the impressed fields and electromagnetic waves, whereby an image of the concentration distribution of the specified atomic nucleus in a specified plane of said body is obtained, the improvement comprising a coil holder made of a material containing none of said specified atomic nucleus both for holding the coil in a predetermined shape and for suitably spacing said coil from said body when positioned in the coil, a pair of standard signal sources made of a material containing said specified atomic nucleus and disposed in said coil holder for facing each other through a body positioned in the coil for compensating a projection signal, and a drive device for rotating said coil holder with its signal sources and said coil as a unit in synchronism and cooperation with the electric rotations of said gradient magnetic field, said paired standard signal sources always being positioned in the isomagnetic field surfaces on both the sides of said body.

DESCRIPTION OF THE PREFERRED EMBODIMENT

Figure 1:
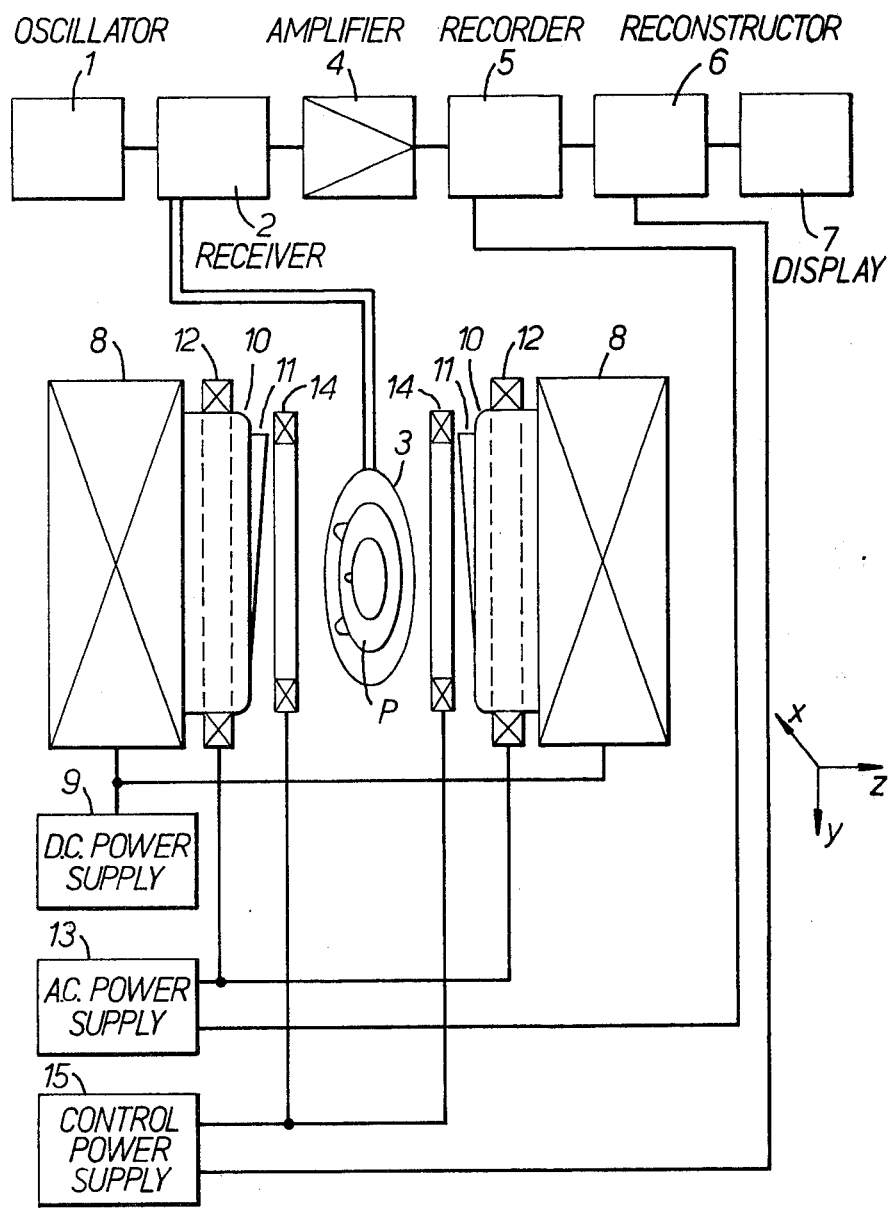
FIG. 1 is a view showing the schematic general construction of nuclear magnetic resonance apparatus for measuring the concentration distribution of a specified atomic nucleus in a body.
Figure 2:
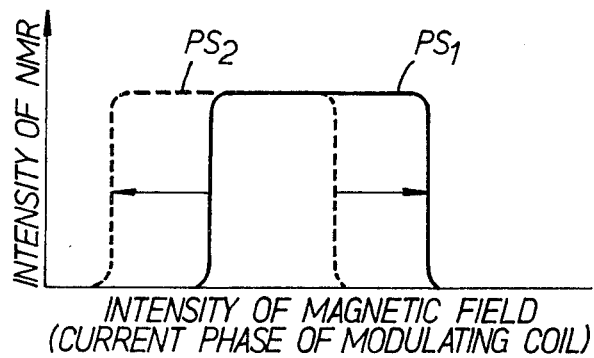
FIGS. 2, 3(a), 3(b) and 3(c) are diagrams for explaining the problems concomitant with the apparatus of FIG. 1.
Figure 3:
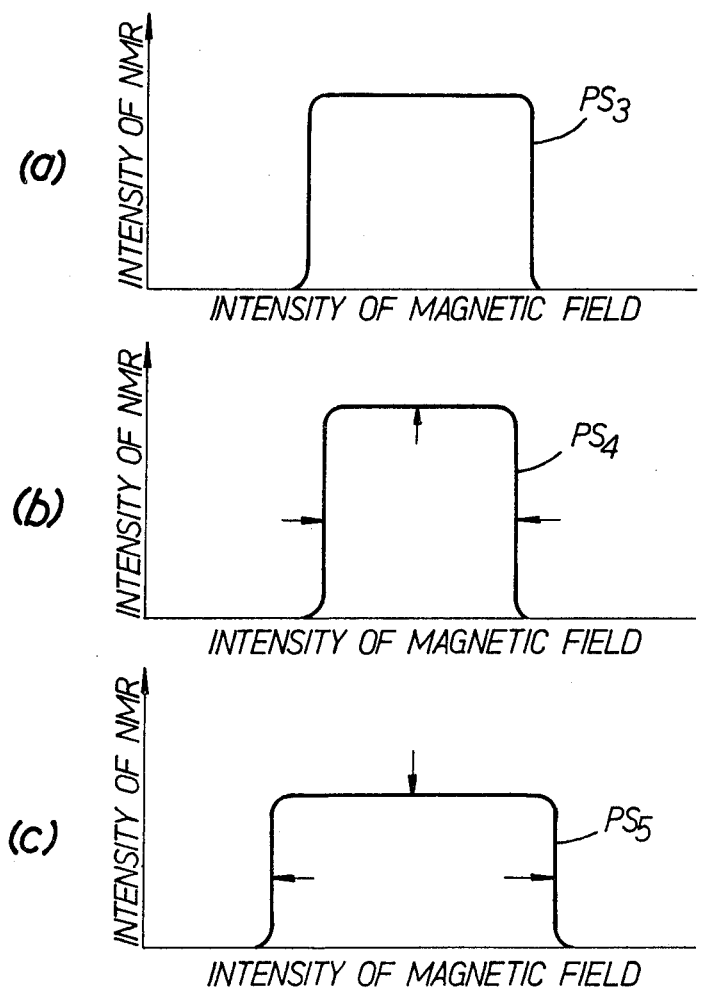
Figure 4:
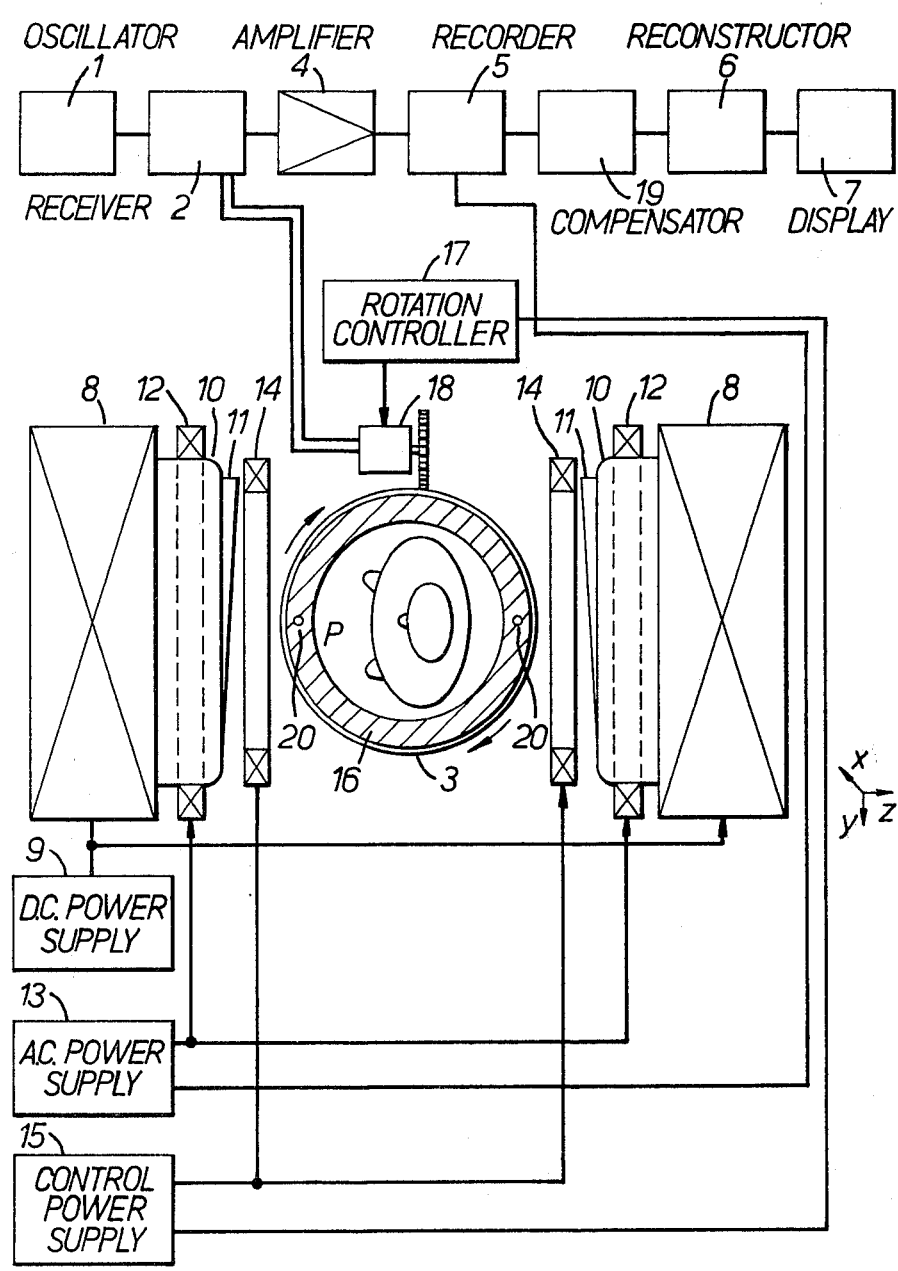
FIG. 4 is a view showing the schematic construction of one embodiment of this invention.

Referring to FIG. 4, the oscillator 1 of selectably variable output intensity for generating the high-frequency waves, the bridge type receiver 2, the coil 3 wound around the body P for impressing the high-frequency waves upon the body and for extracting the NMR signal from the body P, the amplifier 4, the recorder 5 for recording the NMR signal in synchronism with the modulating magnetic field, the reconstructor 6, the display 7, the electromagnets 8 for generating the homogeneous static magnetic field, the stabilizing power supply 9 for the electromagnets 8, the magnet plate members 10 for the electromagnets 8, the shims 11, the modulating coil 12, the A.C. power supply 13 for the modulating coils 12, the gradient magnetic field coils 14, and the control power supply 15 for the gradient magnetic field coils 14 correspond to like-numbered parts appearing in FIG. 2. The gradient direction of the total gradient magnetic field which is established by the shims 11 and the gradient magnetic field coils 14 is likewise rotated in a plane y-z with respect to the body P by the control of the control power supply 15.

In addition to those parts, there is provided in FIG. 4 an annular coil holder 16 having a dual function. The coil holder 16 both fixedly holds the shape of the coil 3 and maintains the spacing between the body P and the coil 3. There are also provided in the structure of the embodiment of FIG. 4 a rotation controller 17 and a rotation drive mechanism 18 both comprising a drive device responsive to the signal of the gradient direction from the gradient magnetic coil control power supply 15 for rotating the coil holder 16 and the coil 3 as a unit in accordance with the rotations of the gradient magnetic field.

The coil holder 16 is made of a material containing none of the specified atomic nucleus which is to be measured. More specifically, for example, in case the atomic nucleus ($^1$H) of hydrogen is used as the specified atomic nucleus, the coil holder 16 may be made of 4-fluoride ethylene resin or the like. This coil holder 16 is so constructed that it is formed with a hole portion for receiving the body and the coil 3 is wound around the circumference of the coil holder. Moreover, a pair of standard signal sources 20 containing the specified atomic nuclei are buried in the coil holder 16 in a manner to face each other diametrically through the body-holding aperture of the coil holder.

There is further provided a compensator 19 partly for extracting the NMR projection information signal recorded in the recorder 5, in each of the projection directions, compensating each extracted information signal, and for feeding the compensated NMR projection information signal to the reconstructor 6.

Figure 8:
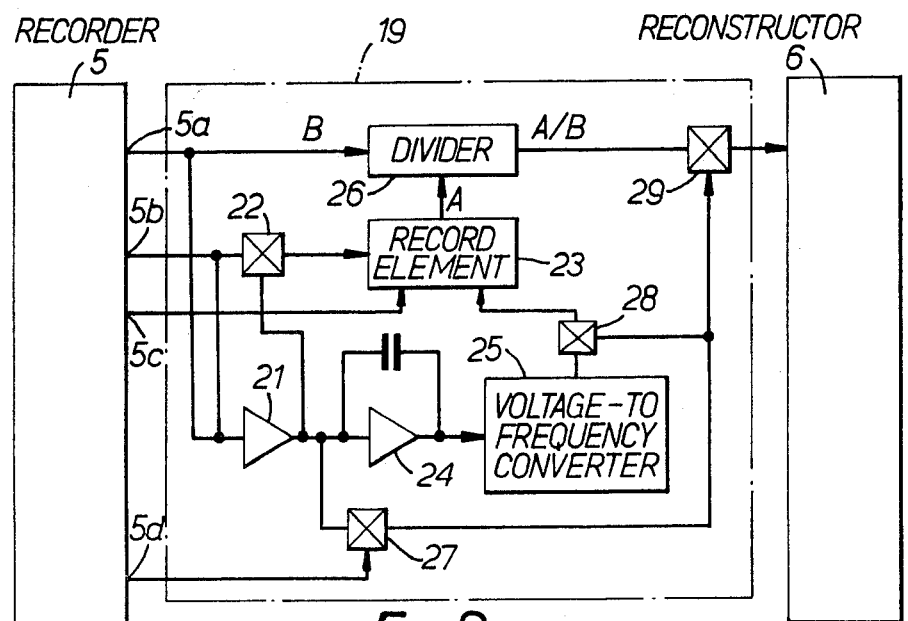
FIG. 8 is a view showing the schematic construction of the compensation of the embodiment of FIG. 4.

As shown in FIG. 8, the NMR projection signal of the body is generated from the output terminal 5b of the recorder 5 and transmitted through an analog switch 22 to a recording element 23 composed, for example, of a charge coupled device (CCD) or the like. Only the part corresponding to the body of the generated NMR projection signal is transmitted to the recording element 23 by the operation of both a comparator 21 and the analog switch 22. Namely, the comparator 21 has a function of holding its own output signal for a predetermined time. Therefore, as the left side standard signal of the NMR signal [shown in FIG. 5(b)] is applied to the comparator 21, it generates the output signal supplied to the analog switch 22 for the predetermined time. Accordingly, the analog switch 22 is opened for the predetermined time to send the part corresponding to the body of the NMR projection signal to the recording element 23, only the part corresponding to the body of the NMR projection signal being recorded in the record element 23. At this time, a writing signal is simultaneously generated from the output terminal 5c of the recorder 5.

The NMR projection signal of the body is also sent to an integrator 24 which generates a voltage signal in proportion to the time width of a signal having more than a predetermined value. The voltage signal is converted to a frequency signal by a voltage-to-frequency convertor 25. That is, the frequency signal is low frequency when the NMR projection signal is compressed and high frequency when elongated.

Next, a standard phantom projection signal is generated from the output terminal 5a of the recorder 5 to apply to a divider 26 and to the comparator 21.

A voltage signal having the predetermined value is also generated from the output terminal 5d of the recorder 5 so that analog switches 27, 28 and 29 are closed by the output of the comparator 21. The frequency output signal of the voltage-to-frequency convertor 25 is applied to the recording element 23 as a reading out signal, by the closing of the analog switch 28, to read out the NMR signal A of the body recorded in the recording element with the period of the reading out signal to the divider 26. The divider 26 divides the NMR signal of the body by the standard phantom signal B sent to the divider 26 to send an output signal A/B to the reconstructor 6 through analog switch 29.

Figure 6:
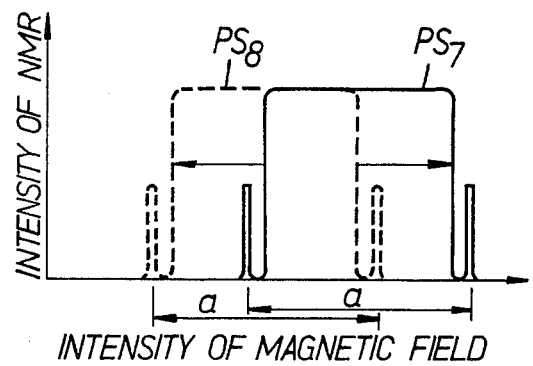

In this case, the NMR signal of the body is recorded in the recording element 23, as described above, so that the output of the divider 26 is compensated for both in its compression and elongation. Also, since only the part corresponding to the body of the NMR signal of the body is recorded in the recording element 23, the parallel movement of the NMR signal shown in FIG. 6 is compensated for. The structure and function of the reconstructor 6 are known, as taught, for example, in U.S. Pat. No. 3,924,129.

In operation, the gradient magnetic field in the direction Y, as shown in FIG. 4, is made by the shims 11 to overlap the homogeneous static magnetic field, and the gradient magnetic field in further made to overlap in the direction Z by the actions of the gradient magnetic field coils 14 and their control power supply 15. As stated previously, the total gradient magnetic field is expressed by a vector summation of the gradient magnetic fields in the two directions. The directions of the two standard signal sources 20 in the coil holder 16 are aligned with the gradient direction of the total gradient magnetic field.

Figure 5:
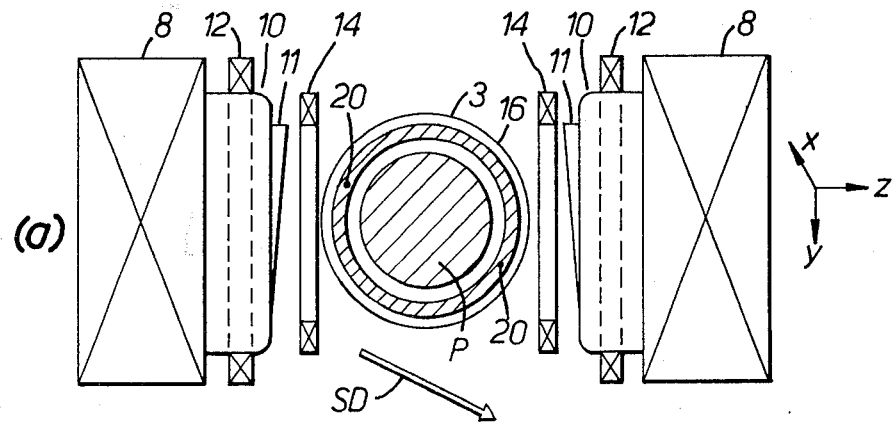
FIGS. 5(a), 5(b), 6 and 7(a), 7(b) and 7(c) are diagrams for explaining the operations and actions of the embodiment of FIG. 4.
Figure 5:
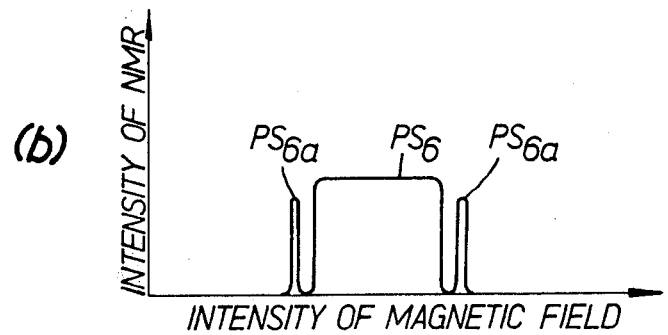

The arrangement relationships and the NMR projection information signal as to the embodiment of FIG. 4 are shown in FIGS. 5(a) and 5(b), respectively. In FIG. 5(b), letters PS6 indicate the NMR projection information signal of the body (which is shown for simplicity in the shape of a homogeneous cylindrical phantom) P whereas letters PS6a indicate the NMR projection information signal of the standard signal sources 20 which are buried in the coil holder 16. Since the coil holder is made of the material containing none of the atomic nucleus to be measured, as has been described hereinbefore, the NMR signal does not appear in the projection information signal, but only the projection signal of the standard signal sources 20 buried therein does appear. As shown in FIG. 5(a), moreover, since the direction of the diameter joining the standard signal sources 20 is in parallel with the gradient direction SD of the gradient magnetic field, the NMR signal (e.g., PS6a) of the standard signal sources 20 does not overlap the NMR projection information signal (e.g., PS6) of the body P.

The NMR projection information signal is obtained by the following procedures. High-frequency waves corresponding to the resonance frequency of the atomic nucleus under examination are generated by the oscillator 1 and are fed from the bridge type receiver 2 through the coil 3 to the body P, and the NMR resonance signal of the body P is detected so that only the resonance signal component is fed from the bridge type receiver 2 to the amplifier 4. The detected NMR signal is simplified by the amplifier 4 and is then fed to the recorder 5. In the meantime, the static magnetic field is alternately varied with low-frequency waves (having a frequency of 10 to 100 Hz) by the actions of the modulating coil 12 and the A.C. power supply 13 so that a portion contributing to the resonance is spacially moved. If the split-phase signal of the A.C. power supply 13 is used as the synchronizing signal for the recorder 5 thereby to consecutively record the NMR signals, it is possible to obtain the NMR projection information signal, as shown in FIG. 5(b).

Next, the NMR projection information signal in another direction is generated by rotating the gradient direction SD of the gradient magnetic field with the output current of the control power supply 15 for the gradient magnetic field coils being varied. In this case, the rotating angular signal is fed from the control power supply 15 to the rotation controller 17 so that the coil 3 and the coil holder 16 are rotated in a manner to correspond to the rotations of the gradient magnetic field by the action of the rotating drive mechanism 18. In this instance, the signal wires between the coil 3 and the receiver 2 are connected by means of the slip-ring method or the like. By rotating the coil holder is a manner to correspond to the rotations of the gradient magnetic field, the NMR signal (PS6a) established by the standard signal sources 20 always appear at both sides of the NMR projection information signal of the body P.

Since the high-frequency magnetic field (H1) established by the coil 3 is more intense in the vicinity of the coil 3 and is substantially uniform at the center portion, the substantially uniform distribution of the high-frequency magnetic field (H1) is established inside of the body P by spacing the coil 3 and the body P with the use of the coil holder 16. On the other hand, the minute differences in the high-frequency magnetic field inside of the body P are made to have a similar intensity distribution at all times for the projection direction by rotating the coil 3 in accordance with the projection direction. As a result, if the NMR projection information signal obtained by the standard phantom is fed in advance to the NMR projection information signal compensator 19, the compensation of the intensity distribution of the high-frequency magnetic field (H1) can be performed with the same intensity for each projection information signal.

If the static magnetic field or the gradient magnetic field is varied, on the other hand, the NMR projection signal is either moved in parallel, compressed, or elongated, as shown in FIGS. 2, 3(a), 3(b) and 3(c), as has been described hereinbefore. In this particular case, according to this invention, it is possible to obtain the NMR projection information signal, as shown in FIG. 6, corresponding to the variation in the static magnetic field, or in FIGS. 7(a), 7(b) and 7(c), corresponding to the variation in the gradient magnetic field.

In case the static magnetic field, as shown in FIG. 6, is varied, the relative position, indicated at "a," of the NMR signal from the standard signal sources 20 is not varied. This is true for either the correct NMR projection information signal PS7 before the variation or an incorrect NMR projection information signal PS8 after the variation so that the parallel movement of the NMR projection information signal can be compensated in response to those two signals by the compensator 19.

Figure 7:
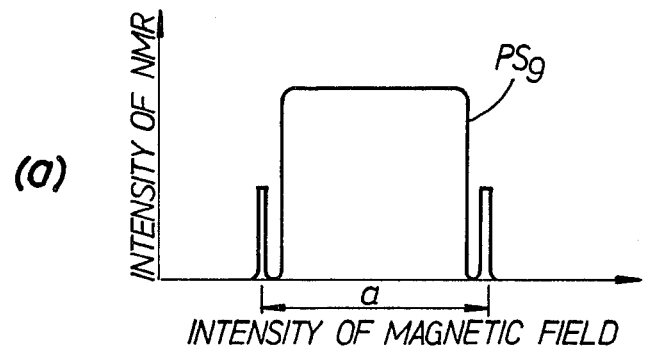
Figure 7:
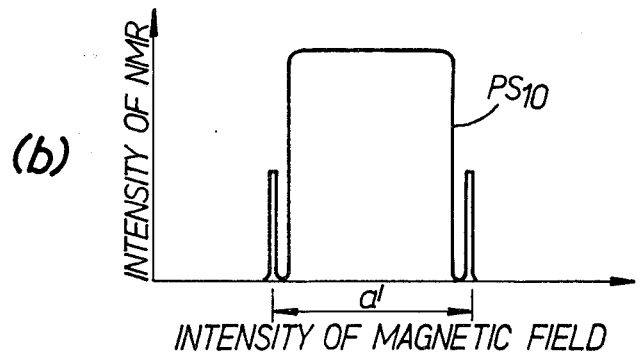
Figure 7:
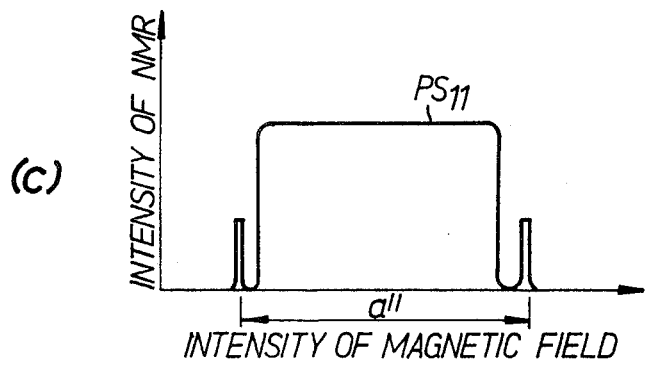

Likewise, in case the gradient of the gradient magnetic field is varied, as shown in FIGS. 7(a), 7(b) and 7(c), the NMR projection signal (one of the NMR projection information signals PS9, PS10 and PS11 in case the gradient is correct before the variation, in case the gradient is increased and in case the gradient is decreased, respectively) is either compressed or elongated so that the projection signal from the standard signal sources 20 have their mutual spacing varied in a corresponding manner from a to a' or a", as shown. If this variation is detected by the compensator 19 so that the projection information signal as a whole is elongated or compressed to restore its original state in a manner to be compensated, it is possible to obtain the correct NMR projection information signal.

The NMR projection information signal compensated by the compensator 19 is fed to the reconstructor 6 so that the image of the concentration distribution of the specified atomic nucleus in the specified plane of the body P is reconstructed and displayed in the display 7.

Thus, in nuclear magnetic resonance apparatus for obtaining the image of the concentration distribution of the specified atomic nucleus in the specific plane of the body by making the gradient magnetic field overlap the homogeneous static magnetic field and by electrically rotating the gradient magnetic field, the coil holder 16 containing the paired standard signal sources 20 and the coil 3 wound thereupon and rotated in synchronism with the rotations of the gradient magnetic field thereby to generate the NMR signal, obtaining the following effects:

(a) Even if the intensities of the static magnetic field and the gradient magnetic field are varied with the passage of time, the NMR projection information signal can be easily compensated by the NMR signal of the projection information signal, which comes from the standard signal sources; and (b) since the coil is always held at the same position with respect to the projection direction, the compensation of the coupling between the coil and the body need not be performed for each angle, but the same compensation can suffice for the object.

This invention should not be limited only to the embodiment, which has been described hereinbefore with reference to the accompanying drawings, but can be practiced in various modifications within the scope of the gist thereof.

For example, the system for rotating the gradient magnetic field should not be limited to that disclosed in the aforementioned embodiment but may be of any type if it can electrically rotate the magnetic field. Moreover, the compensator 19 and the reconstructor 6 both used in the aforementioned embodiment can be constructed by the use of an electronic computer.

What is claimed is:

1. In nuclear magnetic resonance apparatus of the type in which information as to the nuclear magnetic resonance concentration distribution of a specified atomic nucleus in multiple directions in a specified plane of a body to be examined is obtained by means for producing a homogeneous static magnetic field overlapping a gradient magnetic field, means for electrically rotating the isomagnetic field surface of said gradient magnetic field with respect to said body, and coil means including a coil wound around the body, for impressing electromagnetic waves upon the body and for detecting nuclear resonance signals in response to the impressed fields and electromagnetic waves, the improvement comprising:

a coil holder made of a material containing none of said specified atomic nucleus both for holding said coil in a predetermined shape and for suitably spacing said coil from said body when positioned in the coil;

a pair of standard signal sources made of a material containing said specified atomic nucleus and disposed in said coil holder for facing each other through a body positioned in the coil for compensating a projection signal; and a drive device for rotating said coil holder with its signal sources and said coil as a unit in synchronism and cooperation with the electric rotations of said gradient magnetic field, said paired standard signal sources always being positioned in the isomagnetic field surfaces on both sides of said body.

2. The improvement in nuclear magnetic resonance apparatus of claim 1, wherein the means for producing a homogeneous static magnetic field overlapping a gradient magnetic field includes a magnet device for establishing the homogeneous static magnetic field between a pair of magnetic plates, a pair of shims made of a magnetic material and disposed in the magnet plates of said magnet device for inclining the intensity distribution of the static magnetic field in a direction perpendicular to that of the magnetic line of force of the static magnetic field, an electromagnetic device for establishing a gradient magnetic field having an intensity distribution which is gradient with respect to that of the magnetic line of force of the static field and overlaps the static magnetic field, and an oscillator having a frequency corresponding to the nuclear magnetic resonance condition of the atomic nucleus for providing the electromagnetic waves in the coil, and wherein said means for electronically rotating said magnetic field includes a gradient magnetic field controller for controlling said gradient magnetic field electromagnet device for rotating the isomagnetic field surface of the total gradient magnetic field along a predetermined plane of said body, and wherein said improvement also includes:

means for recording the intensities of the nuclear magentic resonance signals detected by said receiver in the plural gradient directions of the isomagnetic field surface corresponding to the positions in a direction normal to said isomagnetic field surface;

a reconstructor for reconstructing the concentration distribution of the predetermined atomic nuclei in the predetermined plane of said body in accordance with the intensities of said recorded nuclear magnetic resonance signals; and a display for displaying the results reconstructed by said reconstructor.

3. The nuclear magnetic resonance apparatus of claim 1 or 2, wherein said specified atomic nucleus is that of hydrogen, and wherein said coil holder is made of 4-fluoride ethylene resin.

* * * * *